US005780776A

United States Patent [19]
Noda

[11] Patent Number: 5,780,776
[45] Date of Patent: Jul. 14, 1998

[54] MULTILAYER CIRCUIT BOARD UNIT

[75] Inventor: Yuji Noda, Tokyo, Japan

[73] Assignee: NEC Corporation, Tokyo, Japan

[21] Appl. No.: 866,315

[22] Filed: May 30, 1997

[30] Foreign Application Priority Data

May 31, 1996 [JP] Japan ................ 7-139276

[51] Int. Cl.⁶ ........................................ H05K 1/03
[52] U.S. Cl. ................ 174/255; 361/764; 174/259; 174/260
[58] Field of Search ........................ 174/255, 260, 174/259, 261, 254; 361/792, 793, 794, 795, 761, 763, 764, 777, 774, 803; 439/91

[56] References Cited

U.S. PATENT DOCUMENTS

| 4,396,936 | 8/1983 | McIver et al. | 174/252 |
| 4,659,872 | 4/1987 | Dery et al. | 174/117 A |
| 4,729,061 | 3/1988 | Brown | 361/719 |
| 5,311,059 | 5/1994 | Banerji et al. | 257/778 |
| 5,495,394 | 2/1996 | Kornfeld et al. | 361/764 |
| 5,527,998 | 6/1996 | Anderson et al. | 174/255 |

FOREIGN PATENT DOCUMENTS 04018787  1/1992  Japan .

*Primary Examiner*—Bot L. Ledynh
*Assistant Examiner*—Kristina Soderquist
*Attorney, Agent, or Firm*—Young & Thompson

[57] ABSTRACT

A multilayer circuit board unit includes a plurality of printed boards, an electronic component, an anisotropic conductive film, and a notched hole. The printed boards have printed circuits on surfaces thereof and are stacked on each other. The electronic component is mounted on at least one of the printed boards and arranged between the printed board on which it is mounted and an adjacent printed board. The anisotropic conductive film electrically connects the printed circuits of the printed boards to each other. The notched hole is formed in the adjacent printed board to correspond to the electronic component.

10 Claims, 6 Drawing Sheets

MULTILAYER CIRCUIT BOARD UNIT

BACKGROUND OF THE INVENTION

The present invention relates to a multilayer circuit board unit for mounting surface mounting components thereon and, more particularly, to a multilayer circuit board unit for performing high-density mounting that realizes a reduction in size and weight when mounting semiconductor chips.

Conventionally, as a multilayer circuit board unit of this type, one disclosed in Japanese Patent Laid-Open No. 4-18787 shown in FIGS. 6A to 6E is known. According to the mounting method disclosed in this reference, a chip component 103 and a jumper chip 104 are soldered to a wiring pattern 102 formed on a printed board 101, as shown in FIG. 6A. A liquid resin, e.g., an epoxy resin, is poured onto the surface of the printed board 101 on which the chip component 103 and the jumper chip 104 have been mounted, and is thermally cured to form a burying resin layer 106 for burying the chip component 103 and the jumper chip 104, as shown in FIG. 6B. This burying resin layer 106 is formed thick enough to fully bury the chip component 103 in it and to enable the top end portion of the jumper chip 104 to be exposed outside of it. The surface of the burying resin layer 106 is then planarized by mechanical polishing.

Subsequently, a silver-based thermosetting conductive paste is printed on the burying resin layer 106 by screen printing and is thermally cured to form a conductive pattern 107, as shown in FIG. 6C. In this manner, a first mounting board 108 is formed. The conductive pattern 107 is in contact with the exposed upper end portion of the jumper chip 104 so as to be conductive with the wiring pattern 102 of the printed board 101.

As shown in FIG. 6D, a second mounting board 116 having a printed board 111 consisting of an insulating board 109 and a wiring pattern 110 and formed in the same manner as in the steps of FIGS. 6A to 6C, and a second mounting board 116 having a chip component 112, a jumper chip 113, a burying resin layer 114, and a conductive pattern 115, is formed.

As shown in FIG. 6E, the surface of the first mounting board 108 where the conductive pattern 107 is formed and the surface of the second mounting board 116 where the conductive pattern 115 is formed are joined and thermally bonded to each other by thermocompression through an anisotropic conductive film 117 so that they are integrated with each other, thereby electrically connecting the printed boards 101 and 111 to each other.

However, in the conventional multilayer circuit board unit described above, each mounting board has a thickness equal to or larger than the sum of the thickness of the printed board and the chip component. When two mounting boards are stacked to face each other, the entire multilayer circuit board unit becomes thick. A resin is sealed in each mounting board to substantially cover its entire surface, leading to a heavy multilayer circuit board unit as a whole. After the burying resin layer is formed, a mechanical polishing step for exposing the jumper chip is required, making the manufacturing operation cumbersome.

SUMMARY OF THE INVENTION

It is an object of the present invention to provide a small, lightweight multilayer circuit board unit which can be manufactured easily.

In order to achieve the above object, according to the present invention, there is provided a multilayer circuit board unit comprising a plurality of printed boards having printed circuits on surfaces thereof and stacked on each other, an electronic component mounted on at least one of the printed boards and arranged between the printed board and an adjacent printed board, connecting means for electrically connecting the printed circuits of the printed boards to each other, and a notched hole formed in the adjacent printed board to correspond to the electronic component.

DESCRIPTION OF THE PREFERRED EMBODIMENTS

The present invention will be described in detail with reference to the accompanying drawings.

Figure 1:
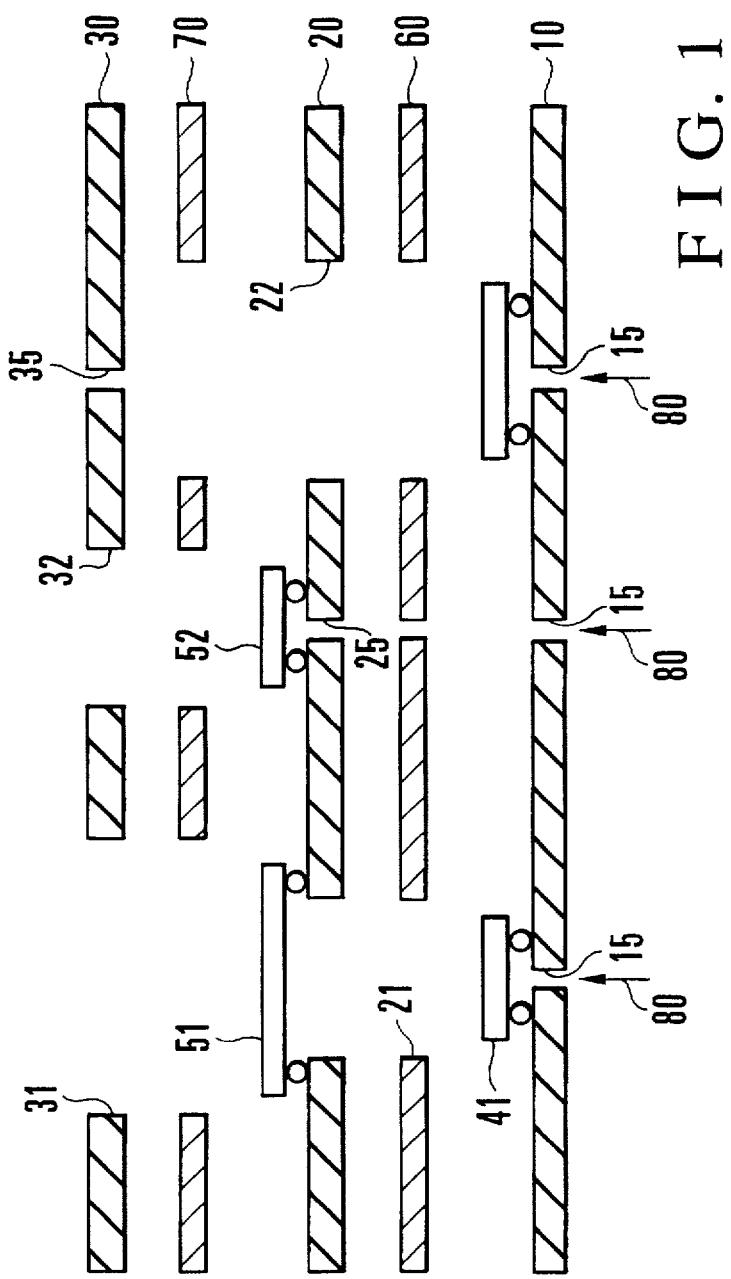
FIG. 1 is an exploded sectional view for explaining the manufacturing process of a multilayer circuit board unit shown in FIG. 2.
Figure 2:
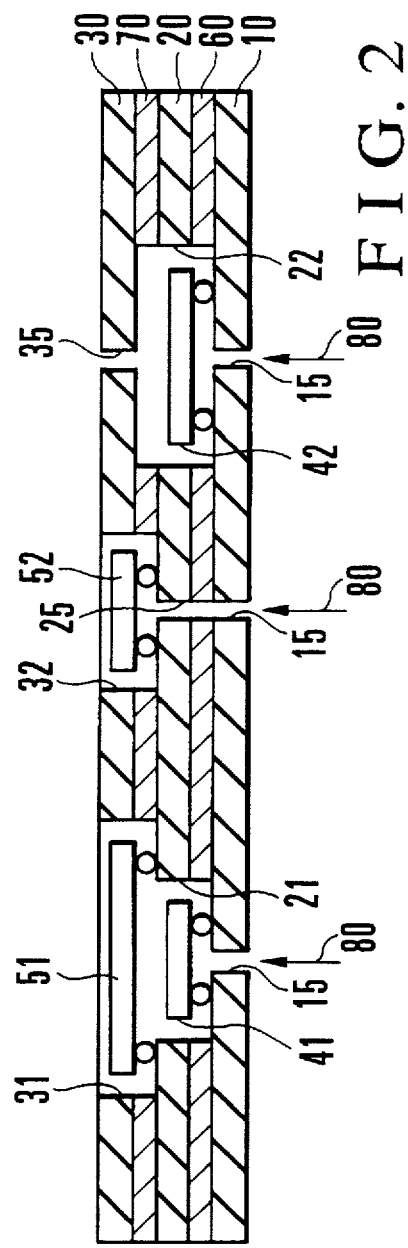
FIG. 2 is a sectional view showing a stacked state of a multilayer circuit board unit according to an embodiment of the present invention.

FIG. 1 shows a multilayer circuit board unit according to an embodiment of the present invention, and FIG. 2 shows a stacked state of the multilayer circuit board unit shown in FIG. 1. Referring to FIGS. 1 and 2, three printed boards 10, 20, and 30 are stacked. Semiconductor chips 41 and 42 as mounting components are mounted on the lower printed board 10 by flip chip bonding. Semiconductor chips 51 and 52 as mounting components are mounted on the intermediate printed board 20 by flip chip bonding. Anisotropic conductive films 60 and 70 are interposed between the printed boards 10 and 20 and between the printed boards 20 and 30, respectively, to form circuits among the printed boards 10, 20, and 30.

Figure 3:
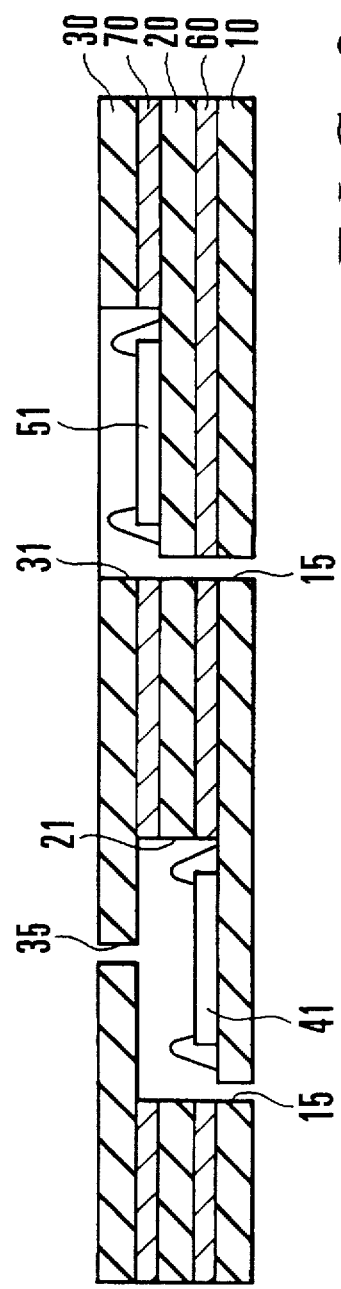
FIG. 3 is a sectional view showing a stacked state of a multilayer circuit board unit according to another embodiment of the present invention.

In the above embodiment, the semiconductor chips 41 and 42, and 51 and 52 are mounted on the printed boards 10 and 20, respectively, by flip chip bonding. However, even if semiconductor chips are mounted by chip-on bonding (COB), as shown in FIG. 3, the same effect can be obtained. The mounting components are not limited to the semiconductor chips 41, 42, 51, and 52, and the same effect can be obtained when other components, e.g., surface mounting components such as a chip resistor or a chip capacitor, are mounted.

Notched holes 21 and 22 are formed in the intermediate printed board 20 to correspond to the semiconductor chips 41 and 42, and notched holes 31 and 32 are formed in the upper printed board 30 to correspond to the semiconductor chips 51 and 52. Therefore, when the lower, intermediate, and upper printed boards 10, 20 and 30 are stacked, the semiconductor chips 41 and 42 will not interfere with the adjacent printed board 20, and the semiconductor chips 51 and 52 will not interfere with the adjacent printed board 30.

In the above embodiment, notched holes are formed in only one printed board adjacent at least to the mounting components. However, if the thickness of the mounting component is larger than that of the printed board, notched holes may be formed in all printed boards with which the mounting components should not interfere. When the end portion of the lead wire of the mounting component projects to the lower surface of the printed board, a notched hole may be formed in a lower printed board below and adjacent to this printed board so that the projecting end portion of the lead wire will not interfere with the lower printed board.

Figure 4:
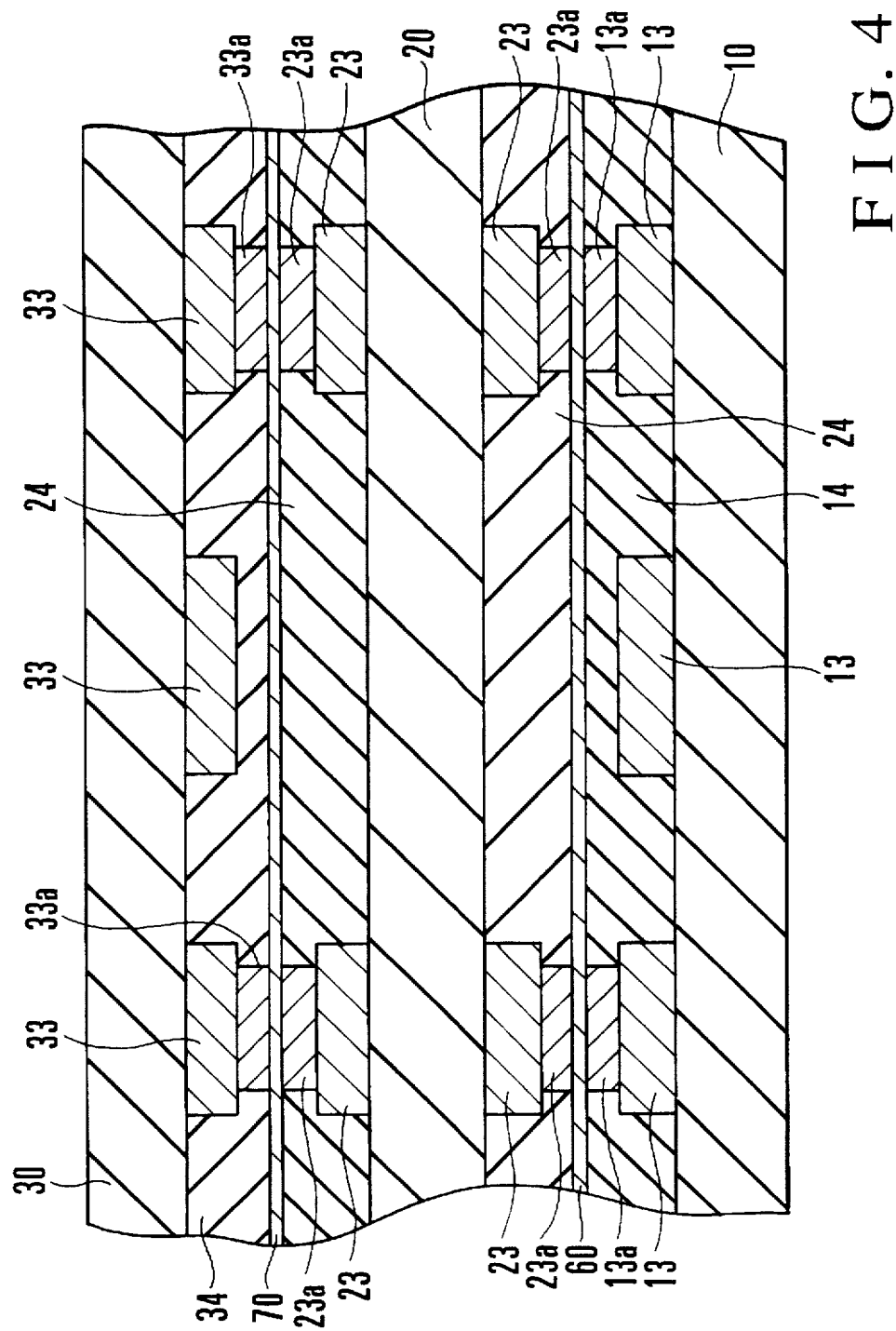
FIG. 4 is an enlarged sectional view showing bumps and anisotropic conductive films formed on the printed circuits of the printed boards at a portion of the embodiment of FIG. 2 that in the interest of clarity, does not include the notched hole and electronic component.

As shown in FIG. 4, a printed circuit 13 is formed on the upper surface of the lower printed board 10, printed circuits 23 are formed on the upper and lower surfaces of the intermediate printed board 20, and a printed circuit 33 is formed on the lower surface of the upper printed board 30. Projecting bumps 13a, 23a, and 33a are formed on the printed circuits 13, 23, and 33 which are to be conductive with the printed boards 10, 20, and 30 that become adjacent to each other when they are stacked.

The bumps 13a, 23a, and 33a can be formed by, e.g., depositing the copper patterns of the printed circuits by gold plating or the additive process and thereafter gold-flashing the surfaces of the deposited copper patterns. The heights of the bumps 13a, 23a, and 33a may preferably designed to be equal to those of solder resists 14, 24, and 34 formed on the printed boards 10, 20, and 30 to insulate the printed circuits 13, 23, and 33, or be larger than them by 10 to 20 μm.

In this manner, the anisotropic conductive films 60 and 70 are sandwiched between the printed boards 10 and 20 with the printed circuits 13 and 23 on which the bumps 13a and 23a are formed and between the printed boards 20 and 30 with the printed circuits 23 and 33 on which the bumps 23a and 33a are formed, respectively, and are positioned. The anisotropic conductive films 60 and 70 are positioned in accordance with the shapes of the two printed boards that sandwich the anisotropic conductive film 60, and the shapes of the two printed boards that sandwich the anisotropic conductive film 70. More specifically, the anisotropic conductive film 60 is formed to correspond to a through hole 25 and the notched holes 21 and 22 of the printed board 20, and the anisotropic conductive film 70 is formed to correspond to the notched hole 22 of the printed board 20 and the notched holes 31 and 32 of the printed board 30.

Therefore, the bumps 13a and 23a oppose the anisotropic conductive film 60 to come into contact with it, and the bumps 23a and 33a oppose the anisotropic conductive film 70 to come into contact with it. In this state, a pressure is vertically applied to the resultant structure, and the structure is heated, to electrically connect the printed circuits 13, 23, and 33 to each other. As a result of thermocompression bonding, the anisotropic conductive films 60 and 70 have conductivity along a direction across electrodes that oppose each other and insulating properties along a direction perpendicularly intersecting the electrodes.

The heating temperature at this time may be set to 160° C. to 190° C. at the conducting connecting portions of the anisotropic conductive films 60 and 70. The pressure may be set to 10 kg/cm² to 50 kg/cm² at the conducting connecting portions of the anisotropic conductive films 60 and 70.

The conductive paths may be formed among the printed boards 10, 20, and 30 in accordance with other methods. For example, in place of forming the bumps 13a, 23a, and 33a on the printed circuits 13, 23, and 33, thick conductive balls may be formed on the two surfaces of each of the anisotropic conductive films 60 and 70, and these balls may be pressed by the printed circuits 13, 23, and 33, thereby pressurizing the anisotropic conductive films 60 and 70. Alternatively, a conductive paste may be applied on the printed boards 10, 20, and 30 to form circuits in the same manner as soldering.

Not only the notched holes 21, 22, 31, and 32 but also resin-pouring through holes 15, the resin-pouring through hole 25, and a resin-pouring through hole 35 are formed in the printed boards 10, 20, and 30. The through holes 15 in the printed board 10 communicate with the through hole 25 and the notched holes 21 and 22 in the printed board 20, and with the through hole 35 and the notched holes 31 and 32 in the printed board 30 in the stacked direction of the printed boards 10, 20, and 30. More specifically, the through holes 15, 25, and 35 are formed at positions of the printed boards 10, 20, and 30 where the semiconductor chips 41, 42, 51, and 52 are mounted. When pouring the sealing resin around the semiconductor chips 41, 42, 51, and 52, a sealing resin 80 is poured through the through holes 15 in the lower printed board 10 corresponding to the mounting positions of the semiconductor chips 41, 42, 51, and 52.

In this manner, when the sealing resin 80 is poured not through the through hole 35 or the notched holes 31 and 32 in the upper printed board 30 but through the through holes 15 in the lower printed board 10, and when the apertures in the printed boards 20 and 30 are utilized as air vent holes, the sealing resin can be charged onto the surfaces of the semiconductor chips 41, 42, 51, and 52 and on the connecting portions of the bumps 13a, 23a, and 33a without forming voids. The resin may be sealed from above as required.

The sealing resin 80 poured through the through holes 15 is charged in the notched holes 21, 22, 31, and 32 to fix the printed boards 10, 20, and 30. The sealing resin charged in the space around the notched hole 22 formed in the printed board 20 has an effect of fixing the lower, intermediate, and upper printed boards 10, 20, and 30.

In the embodiment described above, all the printed boards 10, 20, and 30 are electrically connected to each other by one thermocompression bonding operation. However, these printed boards may be connected one by one as shown in FIGS. 5A to 5F.

Figure 5A:
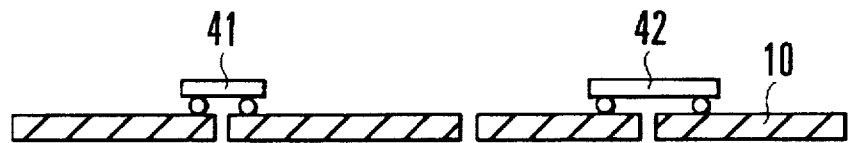
FIGS. 5A to 5F are sectional views showing another example of the manufacturing process of the multilayer circuit board unit shown in FIG. 2.
Figure 5B:
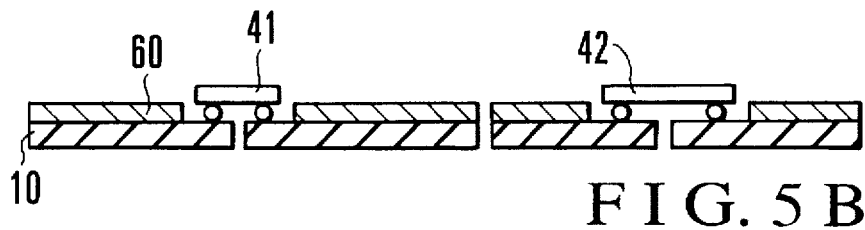
Figure 5C:
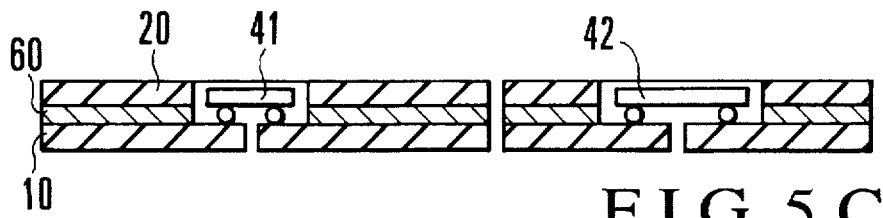

As shown in FIG. 5A, semiconductor chips 41 and 42 are mounted on a printed board 10 by flip chip bonding or the like and electrically connected to the printed board 10. As shown in FIG. 5B, an anisotropic conductive film 60 is arranged on the printed board 10. As shown in FIG. 5C, a printed board 20 is positioned on the anisotropic conductive film 60, and the printed boards 10 and 20 are electrically connected to each other by thermocompression bonding. Thereafter, a sealing resin is charged around the semiconductor chips 41 and 42.

Figure 5D:
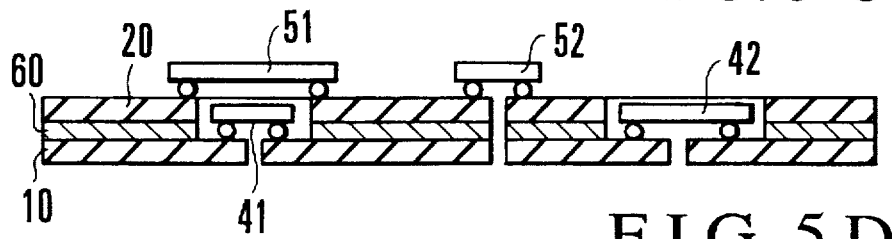
Figure 5E:
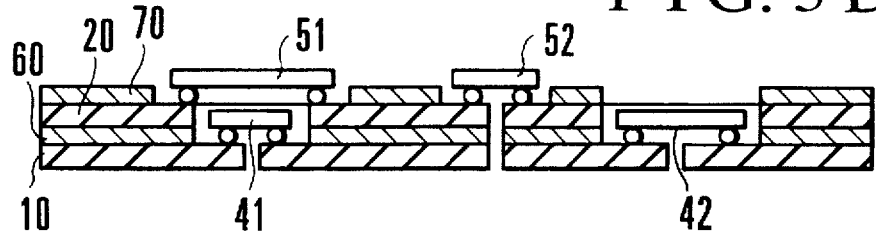
Figure 5F:
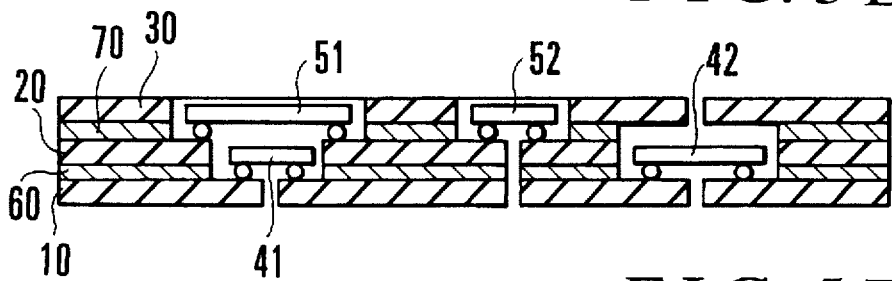
Figure 6A:
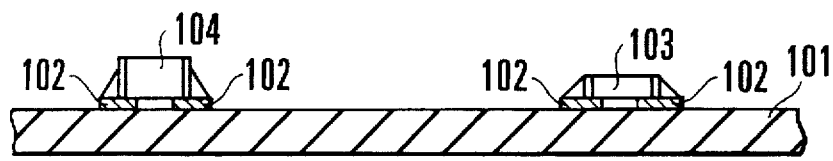
FIGS. 6A to 6E are sectional views showing the manufacturing process of a conventional multilayer circuit board unit.
Figure 6B:
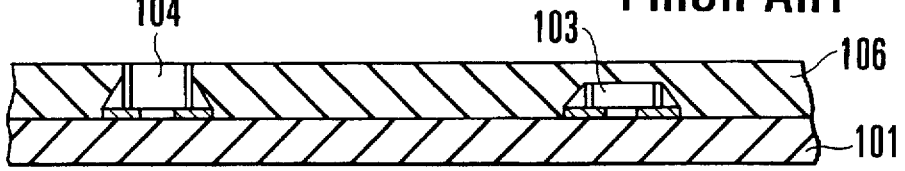
Figure 6C:
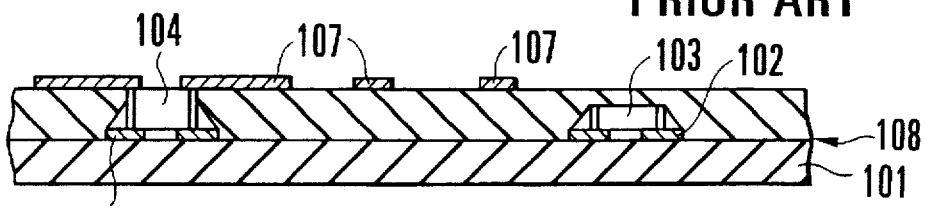
Figure 6D:
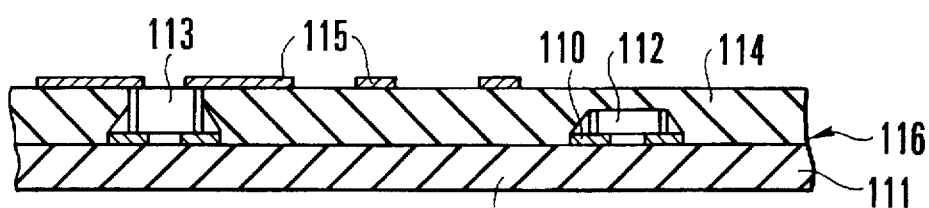
Figure 6E:
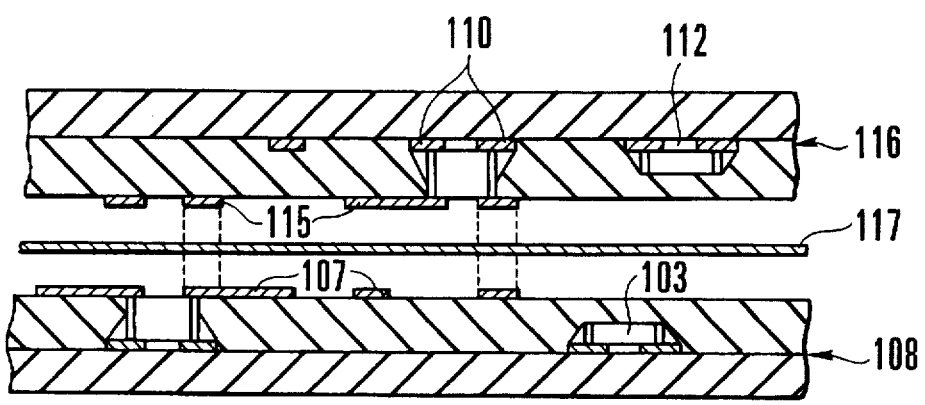

Subsequently, as shown in FIG. 5D, semiconductor chips 51 and 52 are mounted on the printed board 20. As shown in FIG. 5E, an anisotropic conductive film 70 is arranged on the printed board 20. Thereafter, as shown in FIG. 5F, a printed board 30 is positioned on the anisotropic conductive film 70, and the printed boards 20 and 30 are electrically connected to each other by thermocompression bonding.

According to the embodiment described above, when stacking the printed boards 10, 20, and 30, since the notched holes 21, 22, 31, and 32 are formed in the printed boards 20 and 30 in order to prevent them from interfering with the semiconductor chips 41 and 42, and 51 and 52 mounted on the adjacent boards, an increase in thickness of the multilayer circuit board unit can be prevented. Since the bumps 13a, 23a, and 33a are formed on portions of the opposing printed circuits 13, 23, and 33 of the adjacent boards that are to be conductive with each other and the anisotropic conductive films 60 and 70 are sandwiched among the adjacent boards, the printed circuits 13, 23, and 33 are rendered conductive with each other only through the bumps 13a, 23a, and 33a upon thermocompression bonding. When charging the sealing resin, since it is charged only around the semiconductor chips 41, 42, 51, and 52, the amount of sealing resin can be decreased, thereby decreasing the weight of the entire multilayer circuit board unit.

As has been described above, according to the present invention, notched holes are formed in the printed boards to prevent them from interfering with the mounting components, and thereafter the printed boards are stacked. There can be provided a multilayer circuit board unit whose total thickness can be decreased. This is because the components, e.g., a semiconductor chip, can be buried within the thickness of the printed boards. Furthermore, since the components are mounted three-dimensionally, the flat mounting area can be decreased, realizing a reduction in size of the multilayer circuit board unit.

The printed circuits of the adjacent printed boards can be easily made conductive with each other only through predetermined locations while preventing them from unnecessarily becoming conductive with each other. This allows a reduction in weight, since electrical connection among the printed boards is achieved through bumps on the printed circuits, in place of jumper switches described in the conventional case. In the conventional case, a conductive pattern formed by printing a conductive paste by screen printing is used. However, such a conductive pattern is not used in the present invention, largely contributing to a reduction in weight.

The resin is sealed across a plurality of printed boards, so that sealing of the resin and fixing of the printed boards can be performed simultaneously. This also allows a reduction in weight because of the following reason. The sealing resin of the present invention is present only in the space around the mounting components and has a smaller thickness. Therefore, as compared to the resin amount of the conventional burying resin layer, the amount of resin used in the present invention is greatly decreased, which largely contributes to a reduction in weight.

Furthermore, the plurality of printed boards can be fixed simultaneously easily, and it suffices to pour the resin onto the respective mounting components at once from above, facilitating the sealing operation itself.

A reduction in total cost can be realized, because a reduction in number of components and material to be used and simplification in manufacturing process are possible. A reduction in number of components and material to be used will be described in comparison with the conventional case. The jumper switch and a solder for mounting the jumper switch, which were used in the conventional case, are not used in the present invention. The amount of resin to be used is largely decreased in the present invention. Regarding simplification in manufacturing process, the conventional case requires the step of planarizing the surface of the burying resin layer in accordance with mechanical abrasion, and the step of forming the conductive pattern with the conductive paste in accordance with screen printing. However, these steps are not required in the present invention.

What is claimed is:

1. A multilayer circuit board unit comprising:
    a plurality of printed boards having printed circuits on surfaces thereof and stacked on each other;
    an electronic component mounted on at least one of said printed boards and arranged between said one of said printed boards and an adjacent one of said printed boards;
    an anisotropic conductive film sandwiched between each adjoining pair of said printed boards for electrically connecting said printed circuits of said printed boards to each other; and
    a notched hole through said adjacent printed board and at least one adjoining said anisotropic film to make a space for said electronic component.

2. A unit according to claim 1, wherein said anisotropic conductive film is bonded by thermocompression to attain a conductivity along a direction across said printed circuits and insulating properties along a direction perpendicularly intersecting said printed circuits.

3. A unit according to claim 1, further comprising a pair of bumps made of a conductive material and formed at conductive connecting positions of said printed circuits of said printed boards that oppose each other, so that said anisotropic conductive film is sandwiched between said bumps to electrically connect said printed circuits of said printed boards.

4. A unit according to claim 3, further comprising insulating films formed on said printed boards to insulate said printed circuits, so that said bumps are formed to have a height equal to or slightly larger than that of said insulating films.

5. A unit according to claim 1, further comprising a sealing resin in the space around said electronic component in the notched hole.

6. A unit according to claim 5, further comprising through holes formed in said printed boards to communicate with the notched hole along a stacked direction of said printed boards, and said sealing resin is poured through a one of said through holes in at least a lowest one of said printed boards.

7. A unit according to claim 1, wherein said electronic component comprises one of a semiconductor chip, a chip resistor, and a chip capacitor.

8. The unit according to claim 1, wherein said notched hole extends through a further adjoining said anisotropic film so that the space has a thickness greater than a combined thickness of said adjacent printed board and both said adjoining anisotropic films.

9. The unit according to claim 1, wherein said notched hole extends through a further one of said printed boards so that the space has a thickness greater than a combined thickness of said adjacent and said further printed boards.

10. The unit according to claim 9, wherein a further electronic component is within the space.

* * * * *